United States Patent [19]

Smith

[11] Patent Number: 5,313,109
[45] Date of Patent: May 17, 1994

[54] CIRCUIT FOR THE FAST TURN OFF OF A FIELD EFFECT TRANSISTOR

[75] Inventor: David A. Smith, Kowloon, Hong Kong

[73] Assignee: Astec International, Ltd., Hong Kong

[21] Appl. No.: 875,631

[22] Filed: Apr. 28, 1992

[51] Int. Cl.$^5$ .................. H03K 3/01; H03K 17/56; H03K 3/30; H03K 17/60

[52] U.S. Cl. .................. 307/270; 307/246; 307/282; 307/570; 307/572

[58] Field of Search .......... 307/282, 300, 571, 572, 307/253, 270, 570

[56] References Cited

U.S. PATENT DOCUMENTS

| | | | |
|---|---|---|---|
| 4,100,435 | 7/1978 | Komuro | 307/282 |
| 4,461,966 | 7/1984 | Hebenstreit | 307/282 |
| 4,899,065 | 2/1990 | Nakamura | 307/282 |
| 4,903,182 | 2/1990 | Pilukaitis et al. | 363/19 |
| 5,180,930 | 1/1993 | Mayes | 307/572 |

Primary Examiner—William L. Sikes
Assistant Examiner—Trong Phan
Attorney, Agent, or Firm—McCubbrey, Bartels & Ward

[57] ABSTRACT

A circuit for the fast turn off of a field effect transistor (FET) for use in circuits such as a power converter circuit. The FET turn off circuitry includes a gate current sink transistor and a capacitor linked between the base of the gate current sink transistor and the drain of the FET. This capacitor increases the current into the base of the gate current sink transistor, and enables an increased magnitude of current to flow from the FET, thereby increasing the speed with which the FET turns off. A diode is preferably also connected between the base and the emitter of the gate current sink transistor to provide a return path to discharge the capacitor.

7 Claims, 3 Drawing Sheets

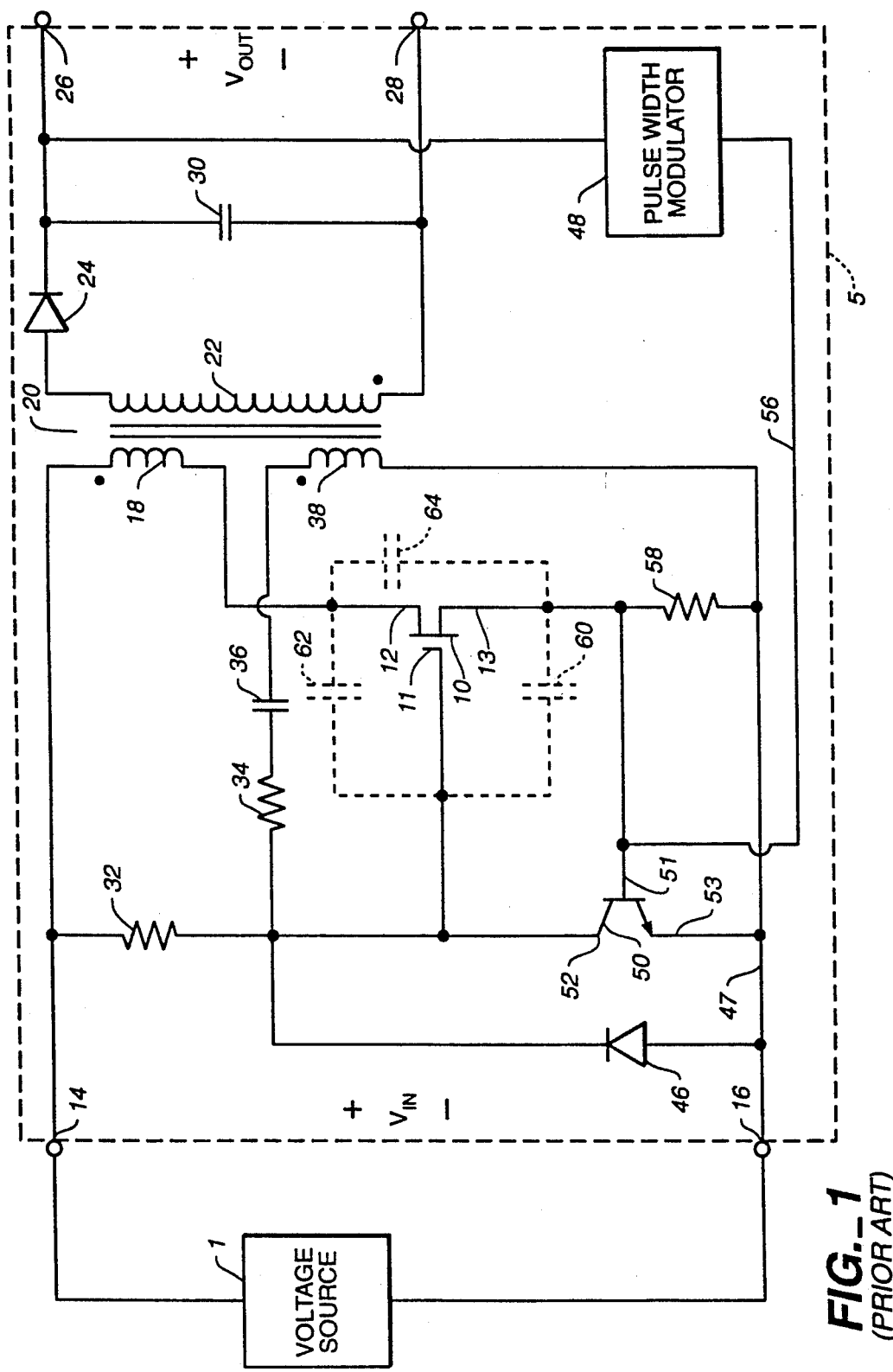
FIG._1
(PRIOR ART)

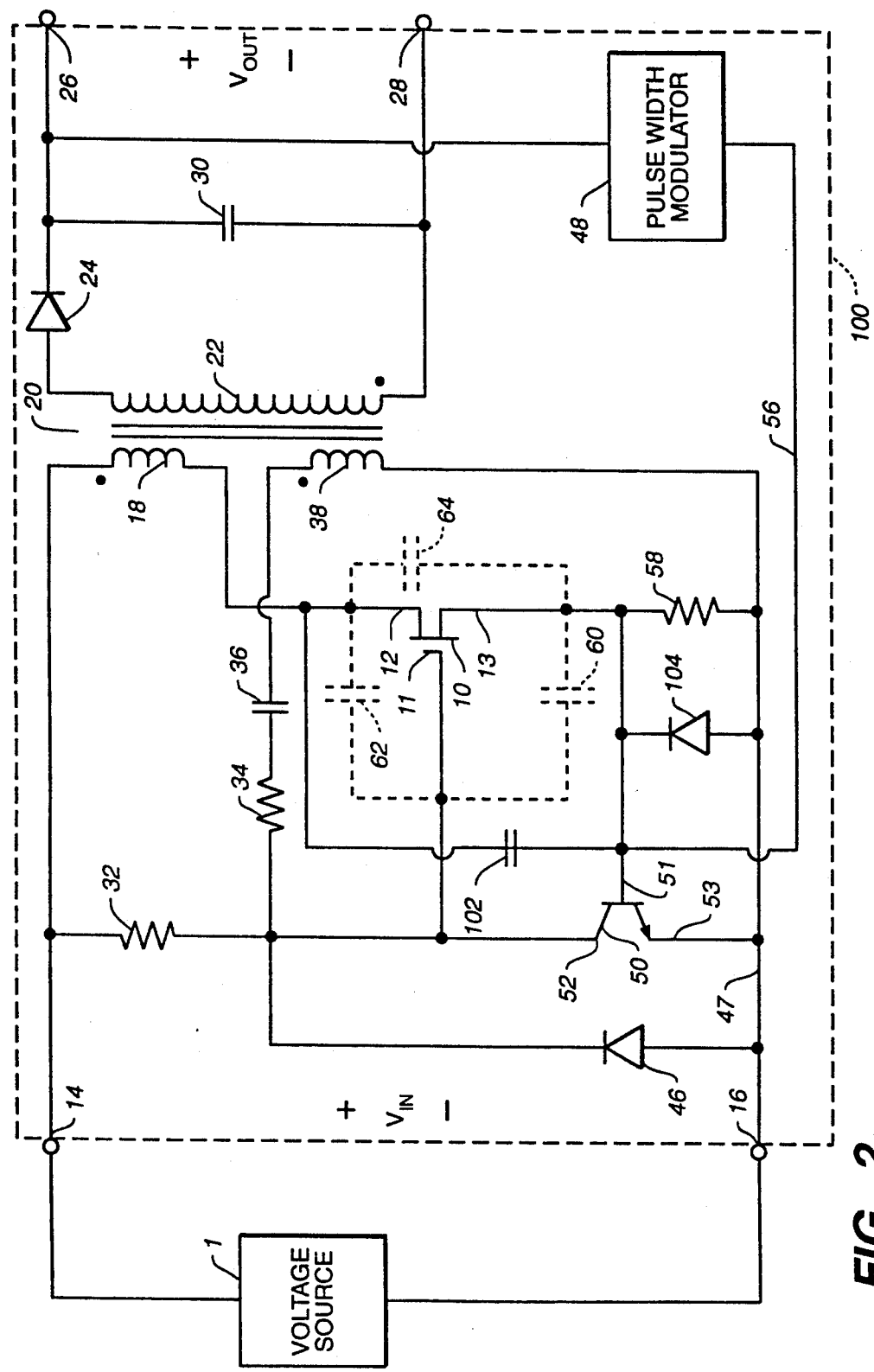
FIG._2

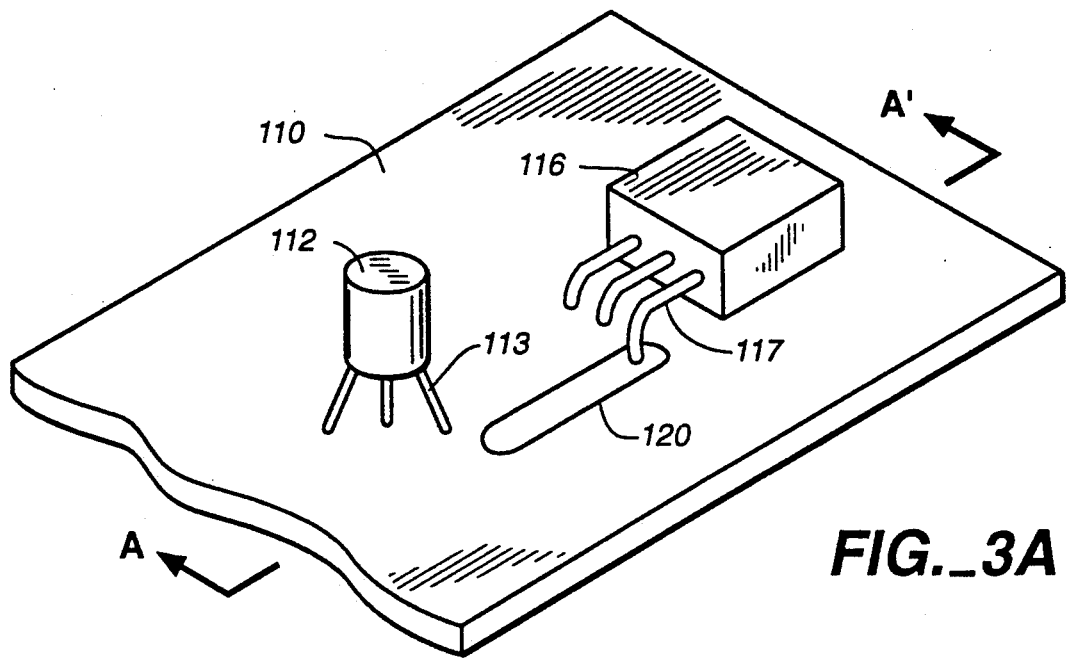
FIG._3A
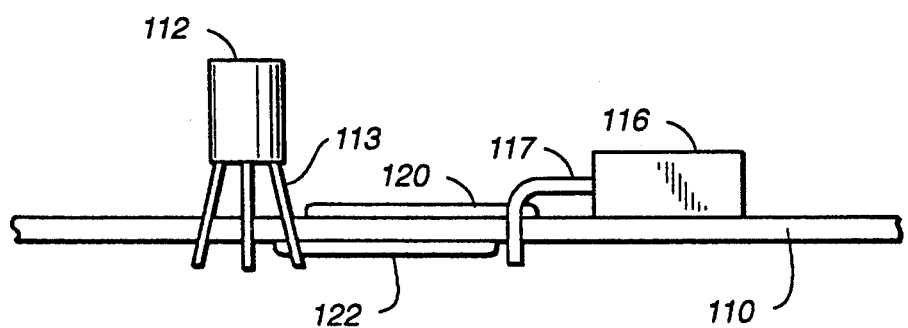
FIG._3B

CIRCUIT FOR THE FAST TURN OFF OF A FIELD EFFECT TRANSISTOR

FIELD OF THE INVENTION

This invention relates to field effect transistors, and more particularly to means for rapidly turning off a field effect transistor operating as a power switch in an electrical circuit.

BACKGROUND OF THE INVENTION

In many electrical devices, such as switching power converters, means are required to switch a large current on and off at a fast rate. Field effect transistors FETs are often used as such power switching means, especially at high switching frequencies. One of the reasons FETs are often used in this application is that FETs generate a lower electrical energy loss when compared with other switching elements at frequencies above approximately 10 kHz.

Even though FETs generate a low electrical energy loss, it is desirable to further lower their energy loss to improve the operation efficiency of a device using a FET. Further, the electrical energy loss of a FET is converted mostly into heat, which could raise the temperature of all the circuit elements in the device. Since the performance and life of most circuit elements are adversely affected by high temperature, the reduction in heat generation by the FET will enhance the performance and reliability of not only the FET, but the device using the FET as well.

One of the major causes of electrical energy loss by a FET is the turn-off loss resulting from the FET switching from a conductive ON state to a nonconductive OFF state. This transition is not instantaneous; it takes a finite period of time. During this transistion period, the drain to source voltage of the FET increases from a value of almost zero to a high value. At the same time, the current flowing through the FET decreases from a high value to almost zero. The power loss is proportional to the product of the current and the drain to source voltage of the FET, and the energy loss is the integral of the power loss over time. During the transition period, the product of the current and the drain to source voltage of the FET could be quite large, thereby leading to a large turn-off power loss. Thus, it is desirable to turn off the FET as fast as possible so that the energy loss can be reduced.

In order to turn off a FET, the voltage of its gate terminal has to be changed. It is well known that the various layers of a semiconductor comprising a FET cause parasitic capacitors to exist between the gate, source, and drain terminals of the FET. In order to change the voltage of the gate terminal, a current is needed for discharging the parasitic capacitors associated with the gate terminal. The magnitude of the current is proportional to the rate of discharging of these capacitors. Thus, a large gate current sink is needed to turn off the FET rapidly. In order to provide such a gate current sink, a gate current sink driver capable of sinking a large current from the gate terminal is typically connected to the gate terminal of the FET.

Typically, a gate current sink driver consists of a transistor having its collector coupled to the gate terminal of a FET for sinking the necessary gate current when the transistor is turned on. In order to reduce the turn off time of a FET, it is desirable to increase the collector current of the transistor. An example of a prior art means for the fast turn off of a FET is disclosed in U.S. Pat. No. 4,903,182, issued to Pilukaitis, et al. This patent discloses the use of a supplementary drive transistor to enhance the gain of the gate current sink transistor in a FET gate current sink circuit. Additional passive circuit elements, such as bias resistors, are also needed in order to use the supplementary drive transistor taught by Pilukaitis, et al.

One of the problems with the above method is that such a supplementary drive transistor and its associated passive circuit elements take up valuable board space. Another problem is the additional cost incurred in using these circuit elements. The present invention eliminates the need for such a supplementary drive transistor.

SUMMARY OF THE INVENTION

It is an object of the present invention to provide a means for enabling a FET to be more rapidly turned off.

It is another object of the present invention to provide a means for reducing the energy loss caused by FET switching operations.

It is a further object of the present invention to provide a means for increasing the amount of current a gate current sink transistor can sink without using a supplemental drive transistor.

It is yet another object of the present invention to provide a means for the turning off of a FET used as a switching element in a power converter.

Broadly stated, the present invention is a device for the fast turn off of a FET having a gate terminal, a first conduction terminal, and a second conduction terminal. The voltage between the first and the second conduction terminals of the FET has a first voltage level when the FET is in a conductive ON state and has a second voltage level when the FET is in a nonconductive OFF state. The second voltage level is higher than the first voltage level during at least a portion of time when the FET is in the OFF state. Means are included for causing said FET to be switched to said ON state. The fast turning off device comprises a gate current sink transistor having a modulation terminal, a first conduction terminal and a second conduction terminal. The first conduction terminal of the gate current sink transistor is coupled to the gate terminal of the FET. The gate current sink transistor is in a conductive ON state when the voltage between the modulation terminal and the second conduction terminal of the gate current sink transistor is at a third voltage level. The gate current sink transistor is in a nonconductive OFF state when the voltage between the modulation terminal and the second conduction terminal of the gate current sink transistor is at a fourth voltage level. The gate current sink transistor provides a conductive path for sinking a large sink current from said gate terminal when the gate current sink transistor is in its ON state. The sink current is a function of a current flowing to the modulation terminal. The fast turning off device also comprises means for causing the gate current sink transistor to turn on and thereby initiate turn off of the FET. The fast turning off device further comprises a feedthrough capacitor coupled between the modulation terminal of the gate current sink transistor and the first conduction terminal of the FET. The feedthrough capacitor delivers additional current to the modulation terminal enabling an increased magnitude of sink current to flow through the first conduction terminal of the gate current sink transistor as the FET begins to switch to its OFF state.

These and other objects of the present invention will become apparent to those skilled in the art from the following detailed description of the invention and from the accompanying drawings.

BRIEF DESCRIPTION OF THE DRAWINGS

FIG. 1 is a schematic diagram of a conventional switching power converter utilizing a prior art means for turning off a FET in the power converter.

FIG. 2 is a schematic diagram of a switching power converter utilizing a means for turning off a FET in the power converter according to the present invention.

FIGS. 3A and 3B are drawings showing the connection between some of the circuit elements of the power converter of FIG. 2 illustrating one way in which the feedthrough capacitor according to the present invention may be formed.

DETAILED DESCRIPTION OF THE INVENTION

FIG. 1 is a schematic diagram of a conventional flyback switching power converter 5 using a FET 10 as a switching element. FET 10 has a gate terminal 11 and two conduction terminals, ordinarily labelled as the drain 12 and the source 13 terminals. The drain terminal 12 is coupled to the primary winding 18 of a power transformer 20. A DC voltage source 1 having a voltage $V_{in}$ is coupled to the input terminals 14 and 16 of converter 5. The voltage $V_{in}$ drives a current through the primary winding 18 of power transformer 20 when FET 10 is in a conductive ON state, thereby causing energy to be stored in power transformer 20. The energy stored in power transformer 20 is coupled to a secondary winding 22 through transformer action when FET 10 is in a nonconductive OFF state.

One end of secondary winding 22 is coupled to the anode of a rectifier 24 and the other end is coupled to an output terminal 28. The cathode of rectifier 24 is coupled to another output terminal 26. A storage capacitor 30 is connected across output terminals 26 and 28. Terminals 26 and 28 deliver an output voltage $V_{out}$ to an external load (not shown). As a result of transformer action, the voltage across secondary winding 22 is of a polarity such that rectifier 24 becomes forward biased during nonconducting intervals of FET 10. During these time intervals, secondary winding 22 supplies an output current which flows through rectifier 24. Consequently the energy stored in power transformer 20 is transferred to output terminals 26 and 28 and capacitor 30. On the other hand, during the conductive intervals of FET 10, the voltage across secondary winding 22 is of a polarity that rectifier 24 becomes reversed biased. During these time intervals, the output voltage $V_{out}$ at terminals 26 and 28 is maintained by storage capacitor 30.

The gate terminal 11 of FET 10 is coupled to a starting resistor 32, which is in turn coupled to voltage source 1 through input terminal 14. When the voltage source 1 is first coupled to input terminal 14, starting resistor 32 raises the potential of gate terminal 11 of FET 10 thereby turning on FET 10. Thereafter, FET 10 is switched on and off periodically, as explained below.

Periodic switching of FET 10 from a non-conductive to a conductive state is accomplished in response to a regenerative feedback drive circuit which includes a feedback winding 38 of power transformer 20 and a series RC network including a resistor 34 and a capacitor 36. The feedback drive circuit is coupled to the gate terminal 11 of FET 10. As is well known in the art, the ringing induced by the magnetizing inductance of transformer 20 at the end of conduction of rectifier 24 is fed back through the RC network and induces the periodic turning on of FET 10.

After FET 10 has been turned on, the voltage at the gate terminal of FET 10 is also maintained by means of the feedback drive circuit. When a current is flowing through primary winding 18 as a result of FET 10 being in a conductive state, the dotted side of winding 38 has a positive voltage and the undotted side has a negative voltage due to transformer action. The voltage of winding 38 is coupled to the gate terminal of FET 10 via resistor 34 and capacitor 36 thereby keeping FET 10 in its conductive state. A diode 46 is connected to a common line 47, which is coupled to input terminal 16, and the gate terminal 11 of FET 10. Diode 46 provides a return path to recharge capacitor 36 when FET 10 later becomes nonconductive.

The periodic turning off of FET 10 is in response to a turn-off circuit comprising a pulse-width modulator 48 and a bipolar junction transistor 50 acting as a gate current sink transistor. Pulse-width modulator 48 is conventional and is widely used in a switching converter for regulating the output voltage. Bipolar junction transistor 50 has a modulation terminal and two conduction terminals, commonly labeled as the base 51, collector 52, and emitter 53 terminals, respectively. The base terminal 51 of transistor 50 is coupled to the output of pulse-width modulator 48 through a line 56. The collector terminal 52 of transistor 50 is coupled to the gate terminal 11 of FET 10. The emitter terminal 53 is coupled to common line 47. When the potential at base terminal 51 is above the base-emitter voltage of transistor 50, transistor 50 is in an ON state. As a result, transistor 50 pulls the gate voltage of FET 10 to a value close to or below the voltage of the source terminal 13. Thus, FET 10 is turned off. On the other hand, when the potential at base terminal 51 is less than the base-emitter voltage of transistor 50, transistor 50 is in an OFF state, i.e., transistor 50 acts as an open circuit. The state of FET 10 is now determined by the voltage generated by the feedback drive circuit.

The input terminal of pulse-width modulator 48 is coupled to the secondary side of converter 5 for sensing the output voltage $V_{out}$. Modulator 48 generates a plurality of pulses having a width related to the output voltage $V_{out}$. Since the output terminal of modulator 48 is connected to the base 51 of transistor 50, these pulses control the ON/OFF states of transistor 50. Thus, modulator 48 is part of a feedback regulation circuit for regulating the output voltage $V_{out}$ across output terminals 26 and 28.

When FET 10 changes from an ON state to an OFF state, the energy stored in primary winding 18 causes the voltage at drain terminal 12 to be higher than the voltage at input terminal 14, as a result of the inductive action of winding 18. After most of the energy stored in power transformer 20 has been transferred to capacitor 30 or the external load, the voltage at drain terminal 12 of FET 10 begins to fall, since there is no longer enough energy in transformer 20 to maintain the drain voltage. As the drain voltage falls, it induces a positive voltage at the dotted terminal of feedback winding 38. Consequently, FET 10 is turned back on, as explained above. As a result, FET 10 goes through periodic ON and OFF cycles.

Converter 5 preferably also includes a resistor 58 coupled between the source terminal 13 of FET 10 and common line 47. The value of resistor 58 is chosen such that when the current flowing through FET 10 reaches a maximum allowable safe value, the voltage across resistor 58 is sufficient to turn transistor 50 on. As a result, FET 10 is turned off in a manner so as to prevent excessive current from flowing through FET 10.

It is known that the various layers comprising a FET cause parasitic capacitors to exist between the gate, source, and drain terminals. In FIG. 1, a capacitor 60 is used to represent the parasitic capacitor between the gate 11 and the source 13 terminals of FET 10. Similarly, capacitors 62 and 64 are used to represent the parasitic capacitors between the gate 11 and the drain 12 terminals and between the drain 12 and the source 13 terminals, respectively, of FET 10. Capacitors 60, 62, and 64 are shown in FIG. 1 in phantom as a reminder that they are only parasitic capacitors and are not actual circuit elements.

In order to lower the gate voltage of FET 10 and thereby turn off FET 10, it is necessary to discharge capacitor 60. Transistor 50, when turned on, provides a conductive path for sinking the current which is used to discharge capacitor 60 through the collector 52 and emitter 53 to the common line 47. The current sunk by the collector 52 is proportional to the base current of transistor 50. In converter 5, this base current is primarily being supplied by modulator 48. Typically, modulator 48 has a limited ability to supply such current, thereby limiting the ability of transistor 50 to sink a current. Since transistor 50 has only a limited ability to sink current, the rate at which capacitor 60 is being discharged, and consequently the time for turning off FET 10, is limited.

The turn off time is further limited by the need to discharge capacitor 62. Shortly after FET 10 is turned off, the voltage at the drain terminal 12 of FET 10 increases, often to a value above the voltage of voltage source 1, as a result of transformer action. Consequently, a current flows from the drain terminal 12 to the gate terminal 11 of FET 10 through capacitor 62. Thus, transistor 50 has to sink this current flowing through capacitor 62, in addition to the current flowing through capacitor 60. As a result, the time for turning off FET 10 is further lengthened.

FIG. 2 is a schematic diagram of a power converter 100 including a fast FET turning off means according to the present invention. The elements that are in both FIG. 2 and FIG. 1 have like reference numerals. The fast FET turning off means according to the present invention in power converter 100 comprises the addition of a capacitor 102 connected between the base terminal 51 of transistor 50 and the drain terminal 12 of FET 10. As explained below, this capacitor provides an additional base current for transistor 50 thereby increasing its ability to discharge the gate terminal 11 of FET 10. As a result, the turn off time of FET 10 is reduced.

The fast FET turning off means of the present invention utilizes the fact that the potential at drain terminal 12 of FET 10 varies from a low value to a high value as FET 10 changes from an ON state to an OFF state. In converter 100, the drain voltage is substantially the same as the source voltage when FET 10 is in an ON state. Consequently, the drain voltage is low. After FET 10 is turned off, the drain voltage rises to a value above the voltage of voltage source 1 because of the inductive action of winding 18. This increased voltage causes a current to flow from the drain terminal 12 of FET 10 through capacitor 102 to the base terminal 51 of transistor 50. As a result, an additional base current is injected into the base terminal 51 of transistor 50 via capacitor 102. Consequently, the collector current of transistor 50 also increases, thereby allowing faster discharge of the charges stored in capacitors 60 and 62. Thus, FET 10 is able to turn off faster.

In power converter 100, a diode 104 is connected between the base terminal 51 and the emitter terminal 53 of transistor 50. It provides a return path to discharge capacitor 102 when the potential at the base terminal 51 of transistor 50 becomes low.

It can be seen that capacitor 102 provides a positive feedback path for increasing the base current of transistor 50 when FET 10 is being turned off. In many switching power supply applications, the capacitance of capacitor 102 is preferably between 2 pF and 10 pF. Since this capacitance is small, it can be built by deliberately increasing the stray capacitance between the base terminal 51 of transistor 50 and the drain terminal 12 of FET 10. An example of such a design is shown in FIGS. 3A and 3B.

FIG. 3A is a perspective view of a portion of a double-sided printed circuit board 110 for providing support and electrical connections to a power converter, such as power converter 100, shown in FIG. 2. FIG. 3A also shows a transistor 112 and a FET 116 having their terminals soldered on board 110. Transistor 112 and FET 116 correspond to transistor 50 and FET 10, respectively, shown in FIG. 2. The drain terminal 117 of FET 116 is electrically connected to a conductive trace 120 which is etched on board 110.

FIG. 3B is a cross-sectional view across section AA' of FIG. 3A. Like parts in FIGS. 3A and 3B have like reference numerals. As can be seen in FIG. 3B, the base terminal 113 of transistor 112 is electrically connected to another conductive trace 122 which is etched on the side of board 110 opposite to that of trace 120. The two traces 120 and 122 are positioned such that they form a parallel plate capacitor connecting base terminal 113 to drain terminal 117. This parallel plate capacitor corresponds to capacitor 102, shown in FIG. 2. As a result, no separate capacitor needs to be added to the power converter. Thus, for the cost of an additional diode, the switching off time of a FET can be drastically improved.

It may be seen, therefore, that the fast turning off means of the present invention allows rapid turn off of a FET in response to a turn-off signal generated by a device such as modulator 48 of FIG. 2. Even though the embodiment of the invention disclosed in FIG. 2 is used in a power converter, this fast turning off means can be used in other applications. For example, in applications other than power converter, the modulator may not be needed. In such case, the turn off signal may be generated by a high impedance source, such as connecting a resistor to the output terminal of a logic gate. This signal is then coupled to the gate terminal of a FET. The collector of a gate current sink transistor is also coupled to the gate terminal of the FET for discharging the charges at the gate terminal rapidly. A capacitor is coupled between the drain terminal of the FET and the base terminal of the gate current sink transistor for generating a base current to drive the gate current sink transistor. A diode is preferably coupled between the base and the emitter terminals of the gate current sink transistor for discharging the capacitor.

Various modifications of the invention, in addition to those shown and described herein, will become apparent to those skilled in the art from the foregoing description and the accompanying drawings. Such modifications are intended to fall within the scope of the appended claims.

For example, the means for switching on transistor 50 may come from a controller independent of the secondary side regulation of the converter. Further, transistor 50 could be a FET instead of a bipolar junction transistor. The FET 10 may also be an auxiliary switch in the circuit, not the primary power switch. In such a case, the signal used to turn on FET 10 will be generated as a function of what FET 10 as being used for.

What is claimed is:

1. A device for the fast turn off of a field effect transistor having a gate terminal, a first conduction terminal, and a second conduction terminal, the voltage between said first conduction terminal and said second conduction terminal of said field effect transistor having a first voltage level when said field effect transistor is in a conductive ON state and having a second voltage level when said field effect transistor is in a nonconductive OFF state, said second voltage level being higher than said first voltage level during at least a portion of time when said field effect transistor is in said OFF state, and means for causing said field effect transistor to be switched to said ON state, said device comprising:
   a gate current sink transistor having a modulation terminal, a first conduction terminal and a second conduction terminal, said first conduction terminal of said gate current sink transistor being coupled to said gate terminal, said gate current sink transistor being in a conductive current sink ON state when the voltage between said modulation terminal and said second conduction terminal of said gate current sink transistor is at a third voltage level, said gate current sink transistor being in a nonconductive current sink OFF state when the voltage between said modulation terminal and said second conduction terminal of the gate current sink transistor is at a fourth voltage level, said gate current sink transistor providing a conductive path for sinking a sink current from said gate terminal when said gate current sink transistor is in said current sink ON state, said sink current being a function of a current flowing to said modulation terminal;
   means for causing said gate current sink transistor to cause said field effect transistor to switch to said OFF state, including means for coupling a current to said modulation terminal; and
   a capacitor coupled between said modulation terminal of said gate current sink transistor and said first conduction terminal of said field effect transistor, said capacitor delivering an additional current to said modulation terminal in response to the turning off of said field effect transistor, for increasing the magnitude of said sink current while said field effect transistor is being switched to said OFF state.

2. The device of claim 1 further comprising a diode coupled between said modulation terminal and said second conduction terminal of said gate current sink transistor, said diode providing a return path for discharging said capacitor when the potential at said modulation terminal becomes low.

3. The device of claim 1 wherein said field effect transistor and said gate current sink transistor are mounted on a double-sided circuit board having a first side and a second side, and said capacitor comprises:
   a first conductive trace disposed on said first side for connecting said modulation terminal and said first conduction terminal of said field effect transistor, and
   a second conductive trace disposed on said second side for connecting said modulation terminal and said first conduction terminal of said field effect transistor, said second and said first conductive traces being positioned such that they form a parallel plate capacitor.

4. A device for fast turn off of a field effect transistor used as a switching element in a power converter, said power converter converting the voltage of an input DC voltage source to an output DC voltage, said power converter including a power transformer having a primary and a secondary winding, a rectifier coupled to said secondary winding for generating said output DC voltage, and a pulse width modulator for generating a series of pulses for causing said field effect transistor to be switched to a non-conductive OFF state, said field effect transistor having a gate terminal, a first conduction terminal, and a second conduction terminal, said first conduction terminal of said field effect transistor being connected to said primary winding for allowing said input DC voltage source to power said primary winding when said field effect transistor is in a conductive ON state, the voltage between said first and said second conduction terminals of said field effect transistor having a first voltage level when said field effect transistor is in said conductive ON state and having a second voltage level when said field effect transistor is in said nonconductive OFF state, said second voltage level being higher than said first voltage level during at least a portion of time when said field effect transistor is in said OFF state, said field effect transistor being caused to switch to said ON state by a means for turning on said field effect transistor, said device comprising:
   a gate current sink transistor having a modulation terminal, a first conduction terminal and a second conduction terminal, said first conduction terminal of said gate current sink transistor being coupled to said gate terminal, said gate current sink transistor being in a conductive current sink ON state when the voltage between said modulation terminal and said second conduction terminal of said gate current sink transistor is at a third voltage level, said gate current sink transistor being in a nonconductive current sink OFF state when the voltage between said modulation terminal and said second conduction terminal of said gate current sink transistor is at a fourth voltage level, said first conduction terminal of said gate current sink transistor causing a sink current to be conducted from said gate through said gate current sink transistor when said gate current sink transistor is in said current sink ON state, said sink current being a function of a current flowing to said modulation terminal;
   means for coupling said pulse-width modulator to said modulation terminal, said pulse-width modulator changing the voltage between said modulation terminal and said second conduction terminal of said gate current sink transistor from said third voltage level to said fourth voltage level; and
   a capacitor coupled between said modulation terminal and said first conduction terminal of said field effect transistor, said capacitor delivering a current to said modulation terminal for increasing the magnitude of said sink current being conducted through said gate current sink transistor when said field effect transistor is being switched to said OFF state.

5. The device of claim 4 further comprising a diode connecting said modulation terminal and said second conduction terminal of said gate current sink transistor, said diode providing a return path for discharging said capacitor.

6. The device of claim 4 wherein said field effect transistor and said gate current sink transistor are mounted on a double-sided circuit board having a first side and a second side, and said capacitor comprises:

a first conductive trace disposed on said first side for connecting said modulation terminal and said first conduction terminal of said field effect transistor; and a second conductive trace disposed on said second side for connecting said modulation terminal and said first conduction terminal of said field effect transistor, said second and said first conductive traces being positioned such that they form a parallel plate capacitor.

7. The device of claim 5 further comprising a resistor having a first end and a second end, said first end being coupled to said second conduction terminal of said field effect transistor and said modulation terminal, said second end being coupled to said second conduction terminal of said gate current sink transistor, said resistor causing said field effect transistor to be in said OFF state when the current flowing through said field effect transistor exceeds a predetermined value.

* * * * *